(12) United States Patent  
Underwood et al.

(10) Patent No.: US 9,343,293 B2  
(45) Date of Patent: May 17, 2016

(54) FLOWABLE SILICON—CARBON—OXYGEN LAYERS FOR SEMICONDUCTOR PROCESSING

(71) Applicant: Applied Materials, Inc., Santa Clara, CA (US)

(72) Inventors: Brian Saxton Underwood, Santa Clara, CA (US); Abhijit Basu Mallick, Palo Alto, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 159 days.

(21) Appl. No.: 13/934,863

(22) Filed: Jul. 3, 2013

(65) Prior Publication Data

US 2014/0302688 A1  Oct. 9, 2014

Related U.S. Application Data

(60) Provisional application No. 61/808,451, filed on Apr. 4, 2013.

(51) Int. Cl.
*H01L 21/02* (2006.01)
*C23C 16/40* (2006.01)
*C23C 16/452* (2006.01)
*C23C 16/455* (2006.01)

(52) U.S. Cl.
CPC ........ *H01L 21/02216* (2013.01); *C23C 16/401* (2013.01); *C23C 16/452* (2013.01); *C23C 16/45565* (2013.01); *C23C 16/45574* (2013.01); *H01L 21/02126* (2013.01); *H01L 21/02274* (2013.01)

(58) Field of Classification Search
CPC ................. H01L 21/02216; H01L 21/02274; H01L 21/02126; C23C 16/45565; C23C 16/401; C23C 16/45574; C23C 16/452
See application file for complete search history.

(56) References Cited

U.S. PATENT DOCUMENTS

| | | | |
|---|---|---|---|
| 6,387,207 | B1 | 5/2002 | Janakiraman et al. |
| 6,830,624 | B2 | 12/2004 | Janakiraman et al. |
| 7,943,531 | B2 * | 5/2011 | Nemani et al. ................ 438/787 |
| 2010/0233886 | A1 * | 9/2010 | Yang et al. .................... 438/786 |
| 2013/0065404 | A1 * | 3/2013 | Weidman et al. ............. 438/786 |

* cited by examiner

*Primary Examiner* — John P Dulka (74) *Attorney, Agent, or Firm* — Kilpatrick Townsend & Stockton LLP (57) ABSTRACT

Methods are described for forming a dielectric layer on a patterned substrate. The methods may include combining a silicon-and-carbon-containing precursor and a radical oxygen precursor in a plasma free substrate processing region within a chemical vapor deposition chamber. The silicon-and-carbon-containing precursor and the radical oxygen precursor react to deposit a flowable silicon-carbon-oxygen layer on the patterned substrate. The resulting film possesses a low wet etch rate ratio relative to thermal silicon oxide and other standard dielectrics.

18 Claims, 4 Drawing Sheets

FLOWABLE SILICON—CARBON—OXYGEN LAYERS FOR SEMICONDUCTOR PROCESSING

CROSS-REFERENCES TO RELATED APPLICATIONS

This application claims the benefit of U.S. Prov. Pat. App. No. 61/808,451 filed Apr. 4, 2013 to Underwood et al., and titled "FLOWABLE SILICON-CARBON-OXYGEN LAYERS FOR SEMICONDUCTOR PROCESSING," which is hereby incorporated herein in its entirety by reference for all purposes.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The miniaturization of semiconductor circuit elements has reached a point where feature sizes of 32 nm, 28 nm, and even 22 nm are fabricated on a commercial scale. As the dimensions continue to get smaller, new challenges arise for seemingly mundane process steps like filling a gap between circuit elements with a dielectric material that acts as electrical insulation. As the width between the elements continues to shrink, the gap between them often gets taller and narrower, making the gap difficult to fill without the dielectric material getting stuck to create voids and weak seams. Conventional chemical vapor deposition (CVD) techniques often experience an overgrowth of material at the top of the gap before it has been completely filled. This can create a void or seam in the gap where the depositing dielectric material has been prematurely cut off by the overgrowth; a problem sometimes referred to as breadloafing.

One solution to the breadloafing problem has been to use liquid precursors for the dielectric starting materials that more easily pour into the gaps like filling a glass with water. A technique currently in commercial use for doing this is called spin-on-glass (SOG) and takes a liquid precursor, usually an organo-silicon compound, and spin coats it on the surface of a substrate wafer. While the liquid precursor has fewer breadloafing problems, other problems arise when the precursor material is converted to the dielectric material. These conversions often involve exposing the deposited precursor to conditions that split and drive out the carbon groups in the material, typically by reacting the carbon groups with oxygen to create carbon monoxide and dioxide gas that escapes from the gap. These escaping gases can leave behind pores and bubbles in the dielectric material similar to the holes left behind in baked bread from the escaping carbon dioxide. The increased porosity left in the final dielectric material can have the same deleterious effects as the voids and weak seams created by conventional CVD techniques.

More recently, techniques have been developed that impart flowable characteristics to dielectric materials deposited by CVD. These techniques can deposit flowable precursors to fill a tall, narrow gap without creating voids or weak seams, while avoiding the need to outgas significant amounts of carbon dioxide, water, and other species that leave behind pores and bubbles. Exemplary flowable CVD techniques have used carbon-free silicon precursors that require very little carbon removal after the precursors have been deposited in the gap.

While the new flowable CVD techniques represent a significant breakthrough in filling tall, narrow (i.e., high-aspect ratio) gaps with dielectric materials such as silicon oxide, there is still a need for techniques that can seamlessly fill such gaps with carbon-rich, low-κ dielectric materials. These materials generally have a lower dielectric constant (κ) than a pure silicon oxide or nitride, and typically achieve those lower κ levels by combining silicon with carbon species. Among other topics, the present application addresses this need by describing flowable CVD techniques for forming silicon-and-carbon containing dielectric materials on a substrate.

BRIEF SUMMARY OF THE INVENTION

Methods are described for forming and curing a flowable silicon-carbon-oxygen (Si—C—O) layer on a semiconductor substrate. The silicon and carbon constituents may come from a silicon and carbon containing precursor while the oxygen may come from an oxygen-containing precursor that has been activated to speed the reaction of the oxygen with the silicon-and-carbon-containing precursor at lower deposition chamber temperatures. Exemplary precursors include 1,3,5-trisilapentane ($H_3Si$—$CH_2$—$SiH_2$—$CH_2$—$SiH_3$) as the silicon-and-carbon-containing precursor and plasma activated oxygen ($O_2$) as the source of oxygen. 1,4-disibutane may be used to replace or augment the 1,3,5-trisilapentane. When these precursors react in the deposition chamber, they deposit a flowable silicon-carbon-oxygen layer on the semiconductor substrate. In those parts of the substrate that are structured with high-aspect ratio gaps, the flowable silicon-carbon-oxygen material may be deposited into those gaps with significantly fewer voids and weak seams.

The final silicon-carbon-oxygen film may exhibit increased etch resistance to both conventional oxide and nitride dielectric etchants. For example, the silicon-carbon-oxygen film may have better etch resistance to a dilute hydrofluoric acid solution (DHF) than a silicon oxide film, and also have better etch resistance to a hot phosphoric acid solution than a silicon nitride film. The increased etch resistance to both conventional oxide and nitride etchants allows these silicon-carbon-oxygen films to remain intact during process routines that expose the substrate to both types of etchants.

Embodiments of the invention include methods of forming a silicon-carbon-oxygen layer on a patterned substrate. The methods include transferring the patterned substrate into a substrate processing region of a substrate processing chamber. The methods further include flowing an oxygen-containing precursor into a remote plasma region while igniting a remote plasma to form a radical oxygen precursor. The methods further include flowing a silicon-and-carbon-containing precursor into a substrate processing region without first passing the silicon-and-carbon-containing precursor through a plasma. The silicon-and-carbon-containing precursor has two distinct silicon atoms separated by at least one carbon atom. The methods further include flowing the radical oxygen precursor into the substrate processing region. The methods further include combining the silicon-and-carbon-containing precursor and the radical oxygen precursor in the substrate processing region to form a silicon-carbon-oxygen layer on the patterned substrate. The silicon-carbon-oxygen layer is flowable during formation.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

Methods are described for applying flowable CVD techniques to the formation of flowable silicon-carbon-oxygen containing layers.

The silicon-and-carbon-containing precursors discussed herein have been found to produce silicon-carbon-oxygen films which have a desirably low wet etch rate despite being flowable during deposition. The silicon-and-carbon-containing precursors contain two distinct silicon atoms separated by one or more intermediate, covalently bonded atoms which may be one or two carbon atoms. For example, the silicon-and-carbon-containing precursor may include a Si—C—Si sequence or a Si—C—C—Si sequence. Larger sequences are also possible (e.g. Si—C—C—C—Si or Si—C—C—C—C—Si) and may include atoms other than carbon between the two distinct silicon atoms. The adjective distinct is used throughout to ensure that the two silicon atoms cannot be construed as a single silicon atom in an atomic ring structure. Each silicon-and-carbon-containing precursor must have at least two silicon atoms. Silicon-and-carbon-containing precursors such as these, when combined with a radical-oxygen precursor to be described shortly, resist the loss of carbon from the forming film. The retention of carbon in the film has been found to desirably increase the etch resistance of the silicon-carbon-oxygen films described herein.

Exemplary Silicon-Carbon-Oxygen Formation Methods

Over the course of describing exemplary film formation methods, specific examples of silicon-and-carbon-containing precursors will be presented. Generally speaking, exemplary film formation methods, many specific examples of precursors will be presented which enable the production of etch resistant silicon-carbon-oxygen films. In disclosed embodiments, there may only be one carbon or only two carbons between the two distinct silicon atoms, aside from non-carbon atoms. The two distinct silicon atoms may be separated by only one carbon or only two carbons, in embodiments of the invention, and the inter-silicon chain may contain only carbon. These arrangement have been found to leave substantial quantities of carbon in the films which helps to maintain desirable etch resistance. In disclosed embodiments, the silicon-and-carbon-containing precursors may be nitrogen-free which helps reduce the dielectric constant.

Figure 1:
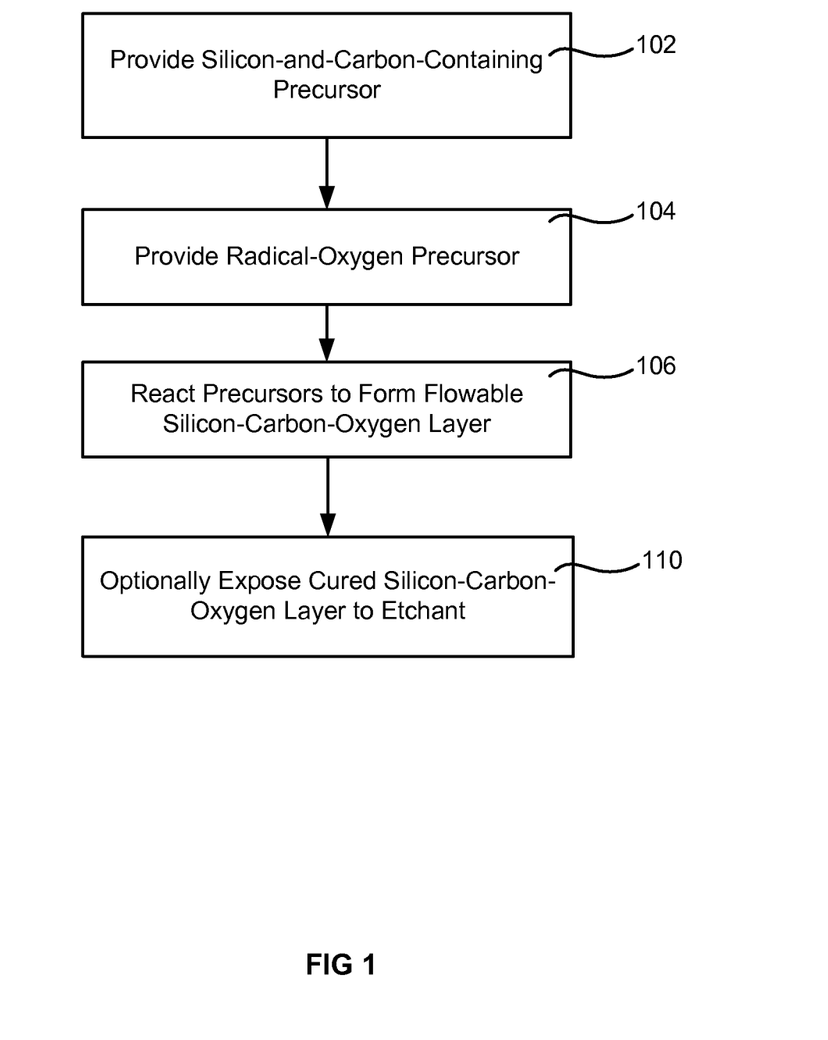
FIG. 1 is a flowchart illustrating selected steps in a method of forming a silicon-carbon-oxygen containing dielectric layer on a substrate.

Referring now to FIG. 1, selected steps in a method of forming a silicon-carbon-oxygen containing dielectric layer on a substrate. The method may include the step of providing a silicon-and-carbon-containing precursor 102 to a chemical vapor deposition chamber. The silicon-and-carbon-containing precursor may provide the silicon constituent to the deposited silicon-carbon-oxygen film, and may also provide the carbon component. Exemplary silicon-and-carbon-containing precursors include 1,3,5-trisilapentane, 1,4,7-trisilaheptane, disilacyclobutane, trisilacyclohexane, 3-methylsilane, silacyclopentene, silacyclobutane, and trimethylsilylacetylene, among others:

Additional exemplary silicon-and-carbon-containing precursors may include disilylalkanes having the formula $R_3Si—[CR_2]_x—SiR_3$, where each R is independently a hydrogen (—H), alkyl group (e.g., —$CH_3$, —$C_mH_{2m+2}$, where m is a number from 1 to 10), unsaturated alkyl group (e.g., —$CH=CH_2$), and where x is a number for 0 to 10. Exemplary silicon precursors may also include trisilanes having the formula $R_3Si—[CR_2]_x—SiR_2—[CR_2]_y—SiR_3$, where each R is independently a hydrogen (—H), alkyl group (e.g., —$CH_3$, —$C_mH_{2m+2}$, where m is a number from 1 to 10), unsaturated alkyl group (e.g., —$CH=CH_2$), and where x and y are independently a number from 0 to 10. Exemplary silicon-and-carbon-containing precursors may further include silylalkanes and silylalkenes of the form $R_3Si$—$[CH_2]_n$—$[SiR_3]_m$—$[CH_2]_n$—$SiR_3$, wherein n and m may be independent integers from 1 to 10, and each of the R groups are independently a hydrogen (—H), methyl (—$CH_3$), ethyl (—$CH_2CH_3$), ethylene (—$CHCH_2$), propyl (—$CH_2CH_2CH_3$), isopropyl (—$CHCH_3CH_3$), tert-butyl (—$C(CH_3)_3$), etc.

Exemplary silicon-and-carbon-containing precursors may further include polysilylalkane compounds may also include compounds with a plurality of silicon atoms that are selected from compounds with the formula R—$[(CR_2)_x$—$(SiR_2)_y$—$(CR_2)_z]_n$—R, wherein at least one of the R's is silane group (e.g., —$SiH_3$, —$(Si_2H_2)_m$—$SiH_3$, where m is a number from 1 to 10)), and where x, y, and z are independently a number from 0 to 10, and n is a number from 0 to 10. In disclosed embodiments, x, y, and z are independently integers between 1 and 10 inclusive. x and z are equal in embodiments of the invention and y may equal 1 in some embodiments regardless of the equivalence of x and z. n may be 1 in some embodiments.

For example when both R groups are —$SiH_3$, the compounds will include polysilylalkanes having the formula $H_3Si$—$[(CH_2)_x$—$(SiH_2)_y$—$(CH_2)_z]_n$—$SiH_3$. The silicon-and-carbon-containing compounds may also include compounds having the formula R—$[(CR'_2)_x$—$(SiR''_2)_y$—$(CR'_2)_z]_n$—R, where each R, R', and R'' are independently a hydrogen (—H), an alkyl group (e.g., —$CH_3$, —$C_mH_{2m+2}$, where m is a number from 1 to 10), an unsaturated alkyl group (e.g., —CH=$CH_2$), a silane group (e.g., —$SiH_3$, —$(Si_2H_2)_m$—$SiH_3$, where m is a number from 1 to 10), and where x, y and z are independently a number from 0 to 10, and n is a number from 0 to 10. In some instances, one or more of the R' and/or R'' groups may have the formula —$[(CH_2)_x$—$(SiH_2)_y$—$(CH_2)_z]_n$—R''', wherein R''' is a hydrogen (—H), alkyl group (e.g., —$CH_3$, —$C_mH_{2m+2}$, where m is a number from 1 to 10), unsaturated alkyl group (e.g., —CH=$CH_2$), or silane group (e.g., —$SiH_3$, —$(Si_2H_2)_m$—$SiH_3$, where m is a number from 1 to 10)), and where x, y, and z are independently a number from 0 to 10, and n is a number from 0 to 10.

In general terms, the silicon-and-carbon-containing precursors described herein may consist of silicon, carbon and hydrogen in embodiments of the invention. In disclosed embodiments, the silicon-and-carbon-containing precursors may simply be nitrogen-free. On the other hands, the silicon-and-carbon-containing precursors described herein may contain nitrogen as well as silicon, carbon and hydrogen. The silicon-and-carbon-containing precursors may consist of silicon, carbon, nitrogen, and hydrogen. In disclosed embodiments, the two distinct silicon atoms may be separated by one, two or more covalently bonded carbon atoms in series. The silicon atoms may be separated by only carbon atoms (e.g. Si—C—C—Si) or the serial sequence of intervening atoms may be nitrogen-free and/or oxygen-free in embodiments of the invention. In other words, the serial sequence of intervening atoms may be nitrogen-and-oxygen-free, the sequence may have nitrogen but no oxygen, the sequence may have oxygen but not nitrogen, or the sequence may contain both nitrogen and oxygen, in embodiments of the invention.

Still more exemplary silicon-and-carbon-containing precursors may include silylalkanes and silylalkenes such as $R_3Si$—$[CH_2]_n$—$SiR_3$, wherein n may be an integer from 1 to 10, and each of the R groups are independently a hydrogen (—H), methyl (—$CH_3$), ethyl (—$CH_2CH_3$), ethylene (—$CHCH_2$), propyl (—$CH_2CH_2CH_3$), isopropyl (—$CHCH_3CH_3$), etc. They may also include silacyclopropanes, silacyclobutanes, silacyclopentanes, silacyclohexanes, silacycloheptanes, silacyclooctanes, silacyclononanes, silacyclopropenes, silacyclobutenes, silacyclopentenes, silacyclohexenes, silacycloheptenes, silacyclooctenes, silacyclononenes, etc. Specific examples of these precursors may include without limitation the following structures:

Exemplary silicon-and-carbon-containing precursors may further include one or more silane groups bonded to a central carbon atom or moiety. These exemplary precursors may include compounds of the formula $H_{4-x-y}CX_y(SiR_3)_x$, where x is 2, 3, or 4, y is 0, 1, 2 or 3, each X is independently a hydrogen or halogen (e.g., F, Cl, Br), and each R is independently a hydrogen (—H) or an alkyl group. Exemplary precursors may further include compounds where the central carbon moiety is a $C_2$-$C_6$ saturated or unsaturated alkyl group such as a $(SiR_3)_xC$=$C(SiR_3)_x$, where x is 1 or 2, and each R is independently a hydrogen (—H) or an alkyl group. Specific examples of these precursors may include without limitation the following structures:

R = H or $CH_3$
n = 0, 1, 2
X = H, Cl, Br, F, I where X may be a hydrogen or a halogen (e.g., F, Cl, Br).

In addition to the silicon-and-carbon-containing precursor, a radical oxygen precursor may added to the deposition chamber 104. The radical oxygen precursor may contribute some or all of the oxygen constituent in the deposited siliconcarbon-oxygen film. An oxygen-containing precursor is flowed into a remote plasma to form plasma effluents, aka the radical oxygen precursor. Exemplary sources for the oxygen-containing precursor may include ozone ($O_3$), molecular oxygen ($O_2$), atomic oxygen (O), NO, $N_2O$, and $NO_2$, among others. The oxygen-containing precursor may be accompanied by one or more additional gases such a hydrogen ($H_2$), nitrogen ($N_2$), helium, neon, argon, etc. The oxygen-precursor may be nitrogen-free in embodiments to promote the formation of relatively low-K low etch rate dielectric. The remote plasma region may also be devoid of nitrogen (e.g. no nitrogen ($N_2$)) in order to promote the formation of the low-K low etch rate dielectric in embodiments of the invention. In this case, the radical-oxygen (aka the plasma effluents) will also be nitrogen-free. The silicon-carbon-oxygen film may be nitrogen-free in embodiments. The oxygen-precursor may also contain carbon that provides at least some of the carbon constituent in the deposited silicon-carbon-oxygen layer.

The oxygen-containing precursor may be energized by a plasma formed in a remote plasma system (RPS) positioned outside the deposition chamber. The oxygen-containing source may be exposed to the remote plasma where it is dissociated, radicalized, and/or otherwise transformed into the radical oxygen precursor. For example, when the source of oxygen-containing precursor is $O_2$, radical oxygen precursor may include one or more of .O, $O_2$, $O_3$, and oxygen radicals. The radical oxygen precursor is then introduced to the deposition chamber, where it may mix for the first time with the independently introduced silicon-and-carbon-containing precursor.

Alternatively (or in addition), the oxygen-containing precursor may be energized in a plasma region inside the deposition chamber. This plasma region may be partitioned from the deposition region where the precursors mix and react to deposit the flowable silicon-carbon-oxygen film on the exposed surfaces of the substrate. In all remote plasma situations described herein, the deposition region may be described as a "plasma free" region during the deposition process. It should be noted that "plasma free" does not necessarily mean the region is devoid of plasma. The borders of the plasma in the chamber plasma region are hard to define and may encroach upon the deposition region through, for example, the apertures of a showerhead if one is being used to transport the precursors to the deposition region. If an inductively-coupled plasma is incorporated into the deposition chamber, a small amount of ionization may be initiated in the deposition region during a deposition. The remote plasma region may be excited using an inductively-coupled plasma or a capacitively-coupled plasma in embodiments of the invention.

Once in the deposition chamber, the radical oxygen precursor and the silicon-and-carbon-containing precursor may react 106 to form a flowable silicon-carbon-oxygen layer on the substrate. The temperature in the reaction region of the deposition chamber may be low (e.g., less than 100° C.) and the total chamber pressure may be about 0.1 Torr to about 10 Torr (e.g., about 0.5 to about 6 Torr, etc.) during the deposition of the silicon-carbon-oxygen film. The temperature may be controlled in part by a temperature controlled pedestal that supports the substrate. The pedestal may be thermally coupled to a cooling/heating unit that adjust the pedestal and substrate temperature to, for example, about 0° C. to about 150° C.

The initially flowable silicon-carbon-oxygen layer may be deposited on exposed planar surfaces a well as into gaps. The deposition thickness may be about 50 Å or more (e.g., about 100 Å, about 150 Å, about 200 Å, about 250 Å, about 300 Å, about 350 Å, about 400 Å, etc.). The silicon-carbon-oxygen layer may consist of silicon, carbon, oxygen and hydrogen, in embodiments of the invention. The silicon-carbon-oxygen layer is nitrogen-free in disclosed embodiments.

The flowability of the initially deposited silicon-carbon-oxygen layer may be due to a variety of properties which result from mixing a radical oxygen precursor with the silicon-and-carbon-containing precursor. These properties may include a significant hydrogen component in the initially deposited silicon-carbon-oxygen layer as well as the presence of carbon content. The flowability does not rely on a high substrate temperature, therefore, the initially-flowable silicon-carbon-and-oxygen-containing layer may fill gaps even on relatively low temperature substrates. During the formation of the silicon-carbon-and-oxygen-containing layer, the substrate temperature may be below or about 400° C., below or about 300° C., below or about 200° C., below or about 150° C. in embodiments of the invention. In a preferred embodiment, the substrate temperature is below or about 100° C. during formation of the initially-flowable silicon-carbon-and-oxygen-containing layer.

When the flowable silicon-carbon-oxygen layer reaches a desired thickness, the process effluents may be removed from the substrate-processing region and the flow of radical-oxygen into the substrate processing region may be stopped. These process effluents may include any unreacted oxygen-containing and silicon-and-carbon-containing precursors, diluent and/or carrier gases, and reaction products that did not deposit on the substrate. The process effluents may be removed by evacuating the deposition chamber and/or displacing the effluents with non-deposition gases in the deposition region. The carbon content (on an atomic percentage basis) of the silicon-carbon-oxygen layer may be greater than 5% or greater than 8% in disclosed embodiments. In a preferred embodiment, the atomic percentage of carbon content is greater than 10% which further increases the ultimate etch resistance of the initially-flowable silicon-carbon-oxygen films.

The silicon-carbon-oxygen layer may optionally be exposed to one or more etchants 110 following additional post processing steps including destructive or non-destructive curing of the film. An example curing procedure would be the use of an electron beam to remove residual hydrogen in the film providing a denser film to further enhance the etch resistant properties of the material. A wet etch rate ratio (WERR) may be defined as the relative etch rate of the silicon-carbon-oxygen layer (e.g., Å/min) in a particular etchant (e.g., dilute HF, hot phosphoric acid) compared to the etch rate of a thermally-grown silicon oxide layer formed on the same substrate. A WERR of 1.0 means the layer in question has the same etch rate as a thermal oxide layer, while a WERR of less than 1 means the layer etches at a slower rate than thermal oxide. The WERR may be less than 1.0, less than 0.5, less than 0.1, less than 0.05 or less than 0.01 compared to thermal silicon oxide in a dilute HF solution in disclosed embodiments. In some applications higher WERR up to 3.0 may be useful without leading to excess shrinkage of the desired film.

The silicon-carbon-oxygen layers may have increased etch resistance (i.e., lower WERR levels) to wet etchants for both silicon oxides and silicon nitrides. For example, the silicon-carbon-oxygen layer may have a desirably low WERR level when exposed to dilute hydrofluoric acid (DHF), which is a conventional wet etchant for oxide, and may also have a desirably low WERR level when exposed to hot phosphoric acid, which is a conventional wet etchant for nitride. Thus, the treated silicon-carbon-oxygen layers may make good blocking and/or etch stop layers for etch processes that include both oxide and nitride etching steps.

The oxygen containing precursor may be flowed into the remote plasma region at a flow rate between 10 sccm and 2000 sccm, between 20 sccm and 1000 sccm, or between 30 sccm and 300 sccm in disclosed embodiments. The silicon-and-carbon-containing precursor may be supplied in the source of a gas or a liquid. The silicon-and-carbon-containing precursor may be flowed directly into the substrate processing region at a flow rate between 10 sccm and 2000 sccm, between 20 sccm and 1000 sccm, or between 30 sccm and 300 sccm in embodiments of the invention. The silicon-and-carbon-containing precursor may be flowed directly into the substrate processing region (with the assistance of a carrier gas) at a flow rate between 0.1 milligrams per minute and 2000 milligrams per minute, between 0.3 milligrams per minute and 1000 milligrams per minute or between 0.5 milligrams per minute and 100 milligrams per minute in disclosed embodiments.

Exemplary Deposition Systems

Deposition chambers that may implement embodiments of the present invention may include high-density plasma chemical vapor deposition (HDP-CVD) chambers, plasma enhanced chemical vapor deposition (PECVD) chambers, sub-atmospheric chemical vapor deposition (SACVD) chambers, and thermal chemical vapor deposition chambers, among other types of chambers. Specific examples of CVD systems that may implement embodiments of the invention include the CENTURA ULTIMA® HDP-CVD chambers/systems, and PRODUCER® PECVD chambers/systems, available from Applied Materials, Inc. of Santa Clara, Calif.

Examples of substrate processing chambers that can be used with exemplary methods of the invention may include those shown and described in co-assigned U.S. Provisional Patent App. No. 60/803,499 to Lubomirsky et al, filed May 30, 2006, and titled "PROCESS CHAMBER FOR DIELECTRIC GAPFILL," the entire contents of which is herein incorporated by reference for all purposes. Additional exemplary systems may include those shown and described in U.S. Pat. Nos. 6,387,207 and 6,830,624, which are also incorporated herein by reference for all purposes.

Figure 2:
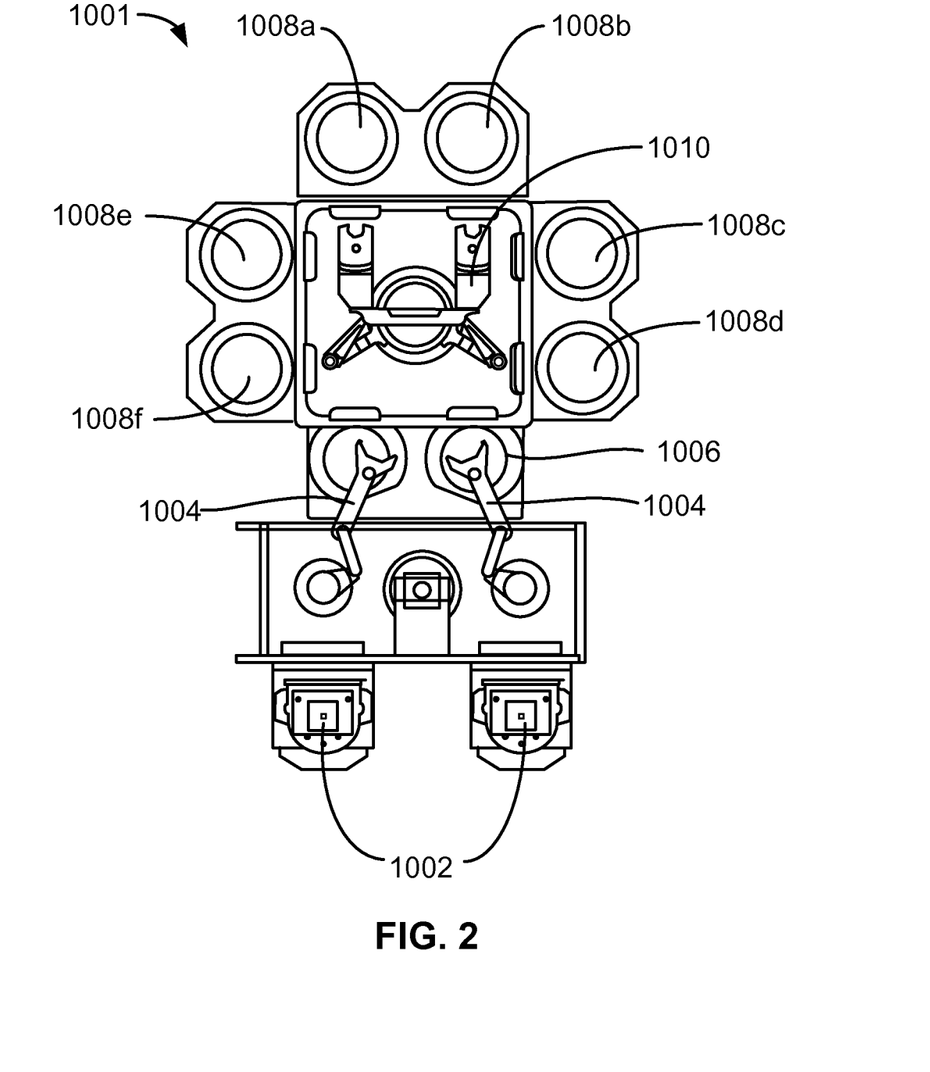
FIG. 2 shows a substrate processing system according to embodiments of the invention.

Embodiments of the deposition systems may be incorporated into larger fabrication systems for producing integrated circuit chips. FIG. 2 shows one such system 1001 of deposition, baking and curing chambers according to disclosed embodiments. In the figure, a pair of FOUPs (front opening unified pods) 1002 supply substrate substrates (e.g., 300 mm diameter wafers) that are received by robotic arms 1004 and placed into a low pressure holding area 1006 before being placed into one of the wafer processing chambers 1008a-f. A second robotic arm 1010 may be used to transport the substrate wafers from the holding area 1006 to the processing chambers 1008a-f and back.

The processing chambers 1008a-f may include one or more system components for depositing, annealing, curing and/or etching a flowable dielectric film on the substrate wafer. In one configuration, two pairs of the processing chamber (e.g., 1008c-d and 1008e-f) may be used to deposit the flowable dielectric material on the substrate, and the third pair of processing chambers (e.g., 1008a-b) may be used to anneal the deposited dielectric. In another configuration, the same two pairs of processing chambers (e.g., 1008c-d and 1008e-f) may be configured to both deposit and anneal a flowable dielectric film on the substrate, while the third pair of chambers (e.g., 1008a-b) may be used for UV or E-beam curing of the deposited film. In still another configuration, all three pairs of chambers (e.g., 1008a-f) may be configured to deposit and cure a flowable dielectric film on the substrate. In yet another configuration, two pairs of processing chambers (e.g., 1008c-d and 1008e-f) may be used for both deposition and UV or E-beam curing of the flowable dielectric, while a third pair of processing chambers (e.g. 1008a-b) may be used for annealing the dielectric film. Any one or more of the processes described may be carried out on chamber(s) separated from the fabrication system shown in different embodiments.

In addition, one or more of the process chambers 1008a-f may be configured as a wet treatment chamber. These process chambers include heating the flowable dielectric film in an atmosphere that includes moisture. Thus, embodiments of system 1001 may include wet treatment chambers 1008a-b and anneal processing chambers 1008c-d to perform both wet and dry anneals on the deposited dielectric film.

Figure 3A:
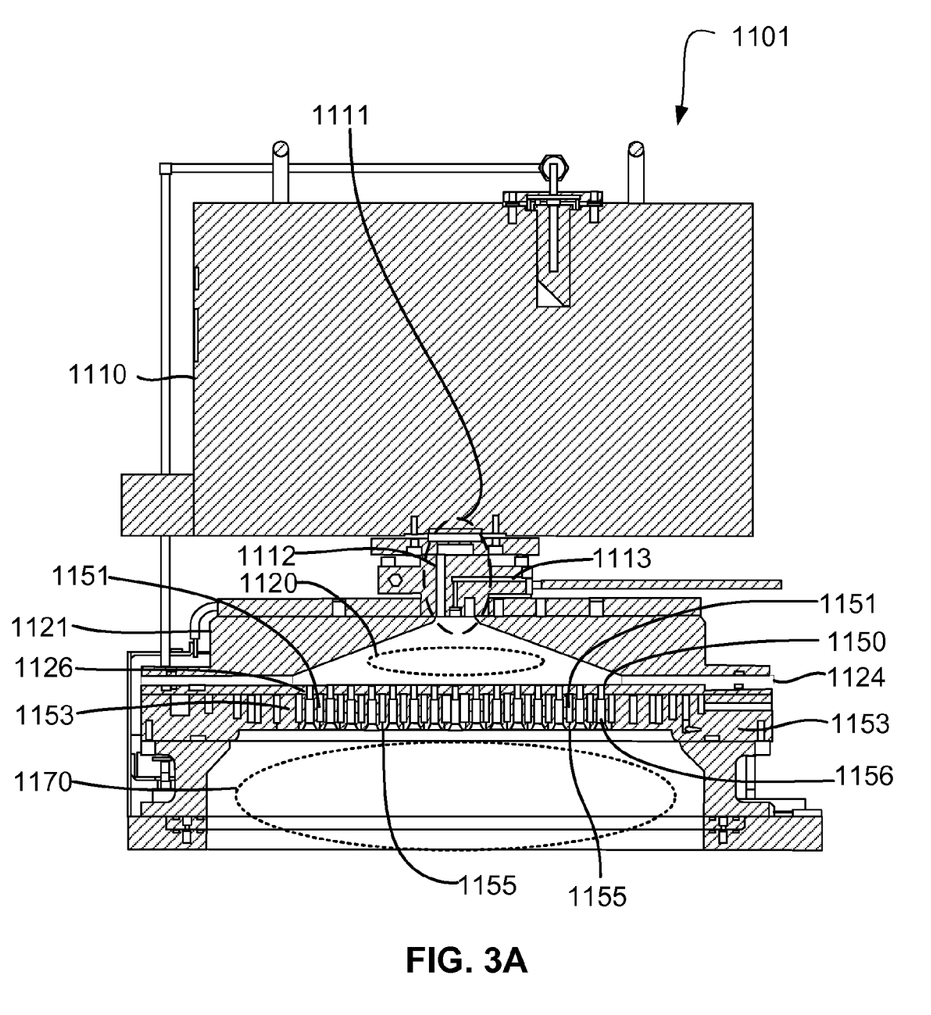
FIG. 3A shows a substrate processing chamber according to embodiments of the invention.

FIG. 3A is a substrate processing chamber 1101 according to disclosed embodiments. A remote plasma system (RPS) 1110 may process a gas which then travels through a gas inlet assembly 1111. Two distinct gas supply channels are visible within the gas inlet assembly 1111. A first channel 1112 carries a gas that passes through the remote plasma system (RPS) 1110, while a second channel 1113 bypasses the RPS 1110. The first channel 1112 may be used for the process gas and the second channel 1113 may be used for a treatment gas in disclosed embodiments. The lid (or conductive top portion) 1121 and a perforated partition 1153 are shown with an insulating ring 1124 in between, which allows an AC potential to be applied to the lid 1121 relative to perforated partition 1153. The process gas travels through first channel 1112 into chamber plasma region 1120 and may be excited by a plasma in chamber plasma region 1120 alone or in combination with RPS 1110. The combination of chamber plasma region 1120 and/or RPS 1110 may be referred to as a remote plasma system herein. The perforated partition (also referred to as a showerhead) 1153 separates chamber plasma region 1120 from a substrate processing region 1170 beneath showerhead 1153. Showerhead 1153 allows a plasma present in chamber plasma region 1120 to avoid directly exciting gases in substrate processing region 1170, while still allowing excited species to travel from chamber plasma region 1120 into substrate processing region 1170.

Showerhead 1153 is positioned between chamber plasma region 1120 and substrate processing region 1170 and allows plasma effluents (excited derivatives of precursors or other gases) created within chamber plasma region 1120 to pass through a plurality of through holes 1156 that traverse the thickness of the plate. The showerhead 1153 also has one or more hollow volumes 1151 which can be filled with a precursor in the form of a vapor or gas (such as a silicon-and-carbon-containing precursor) and pass through small holes 1155 into substrate processing region 1170 but not directly into chamber plasma region 1120. Showerhead 1153 is thicker than the length of the smallest diameter 1150 of the through-holes 1156 in this disclosed embodiment. In order to maintain a significant concentration of excited species penetrating from chamber plasma region 1120 to substrate processing region 1170, the length 1126 of the smallest diameter 1150 of the through-holes may be restricted by forming larger diameter portions of through-holes 1156 part way through the showerhead 1153. The length of the smallest diameter 1150 of the through-holes 1156 may be the same order of magnitude as the smallest diameter of the through-holes 1156 or less in disclosed embodiments.

In the embodiment shown, showerhead 1153 may distribute (via through holes 1156) process gases which contain oxygen and/or plasma effluents of process gases upon excitation by a plasma in chamber plasma region 1120. In embodiments, the process gas introduced into the RPS 1110 and/or chamber plasma region 1120 through first channel 1112 may contain one or more of oxygen ($O_2$), ozone ($O_3$), $N_2O$, NO, and $NO_2$. However, the oxygen-containing precursor may be devoid of nitrogen, the remote plasma region may be devoid of nitrogen, and the resulting Si—O—C film may commensurately be devoid of nitrogen, in disclosed embodiments. The process gas may also include a carrier gas such as helium, argon, nitrogen ($N_2$), etc. The second channel 1113 may also deliver a process gas and/or a carrier gas, and/or a film-curing gas (e.g. $O_3$) used to remove an unwanted component from the growing or as-deposited film. Plasma effluents may include ionized or neutral derivatives of the process gas and may also be referred to herein as a radical-oxygen precursor referring to the atomic constituent of the process gas introduced.

In embodiments, the number of through-holes 1156 may be between about 60 and about 2000. Through-holes 1156 may have a variety of shapes but are most easily made round. The smallest diameter 1150 of through holes 1156 may be between about 0.5 mm and about 20 mm or between about 1 mm and about 6 mm in disclosed embodiments. There is also latitude in choosing the cross-sectional shape of through-holes, which may be made conical, cylindrical or a combination of the two shapes. The number of small holes 1155 used to introduce a gas into substrate processing region 1170 may be between about 100 and about 5000 or between about 500 and about 2000 in different embodiments. The diameter of the small holes 1155 may be between about 0.1 mm and about 2 mm.

Figure 3B:
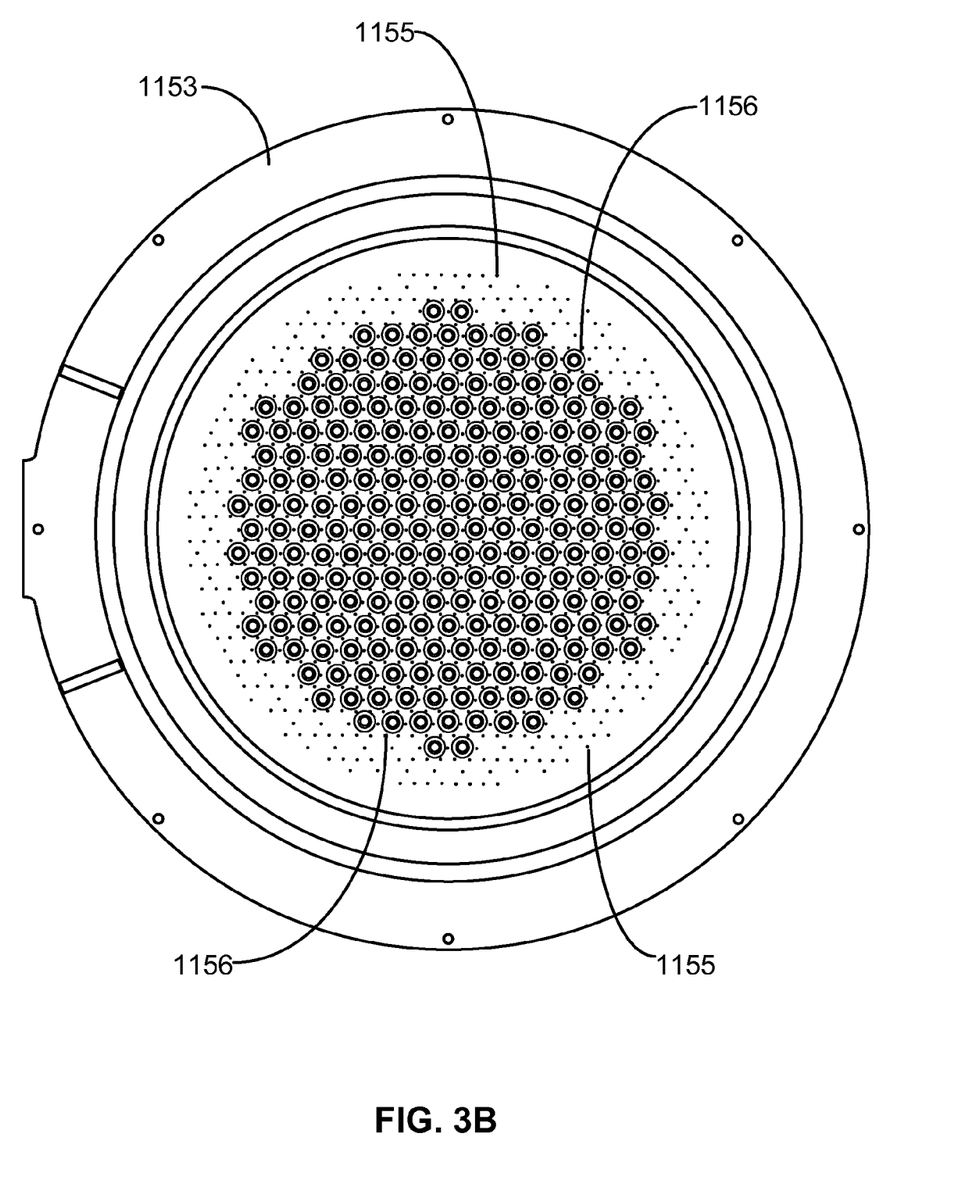
FIG. 3B shows a gas distribution showerhead according to embodiments of the invention.

FIG. 3B is a bottom view of a showerhead 1153 for use with a processing chamber according to disclosed embodiments. Showerhead 1153 corresponds with the showerhead shown in FIG. 3A. Through-holes 1156 are depicted with a larger inner-diameter (ID) on the bottom of showerhead 1153 and a smaller ID at the top. Small holes 1155 are distributed substantially evenly over the surface of the showerhead, even amongst the through-holes 1156 which helps to provide more even mixing than other embodiments described herein.

An exemplary film is created on a substrate supported by a pedestal (not shown) within substrate processing region 1170 when plasma effluents arriving through through-holes 1156 in showerhead 1153 combine with a silicon-and-carbon-containing precursor arriving through the small holes 1155 originating from hollow volumes 1151. Though substrate processing region 1170 may be equipped to support a plasma for other processes such as curing, no plasma is present during the growth of the exemplary film.

A plasma may be ignited either in chamber plasma region 1120 above showerhead 1153 or substrate processing region 1170 below showerhead 1153. A plasma is present in chamber plasma region 1120 to produce the radical-oxygen precursor from an inflow of an oxygen-containing gas. An AC voltage typically in the radio frequency (RF) range is applied between the conductive top portion 1121 of the processing chamber and showerhead 1153 to ignite a plasma in chamber plasma region 1120 during deposition. An RF power supply generates a high RF frequency of 13.56 MHz but may also generate other frequencies alone or in combination with the 13.56 MHz frequency. Exemplary RF frequencies include microwave frequencies such as 2.4 GHz. The top plasma power may be greater than or about 1000 Watts, greater than or about 2000 Watts, greater than or about 3000 Watts or greater than or about 4000 Watts in embodiments of the invention, during deposition of the flowable film.

The top plasma may be left at low or no power when the bottom plasma in the substrate processing region 1170 is turned on during the second curing stage or clean the interior surfaces bordering substrate processing region 1170. A plasma in substrate processing region 1170 is ignited by applying an AC voltage between showerhead 1153 and the pedestal or bottom of the chamber. A cleaning gas may be introduced into substrate processing region 1170 while the plasma is present.

The pedestal may have a heat exchange channel through which a heat exchange fluid flows to control the temperature of the substrate. This configuration allows the substrate temperature to be cooled or heated to maintain relatively low temperatures (from room temperature through about 120° C.). The heat exchange fluid may comprise ethylene glycol and water. The wafer support platter of the pedestal (preferably aluminum, ceramic, or a combination thereof) may also be resistively heated in order to achieve relatively high temperatures (from about 120° C. through about 1100° C.) using an embedded single-loop heater element configured to make two full turns in the form of parallel concentric circles. An outer portion of the heater element may run adjacent to a perimeter of the support platter, while an inner portion runs on the path of a concentric circle having a smaller radius. The wiring to the heater element passes through the stem of the pedestal.

The substrate processing system is controlled by a system controller. In an exemplary embodiment, the system controller includes a hard disk drive, a floppy disk drive and a processor. The processor contains a single-board computer (SBC), analog and digital input/output boards, interface boards and stepper motor controller boards. Various parts of CVD system conform to the Versa Modular European (VME) standard which defines board, card cage, and connector dimensions and types. The VME standard also defines the bus structure as having a 16-bit data bus and a 24-bit address bus.

The system controller controls all of the activities of the deposition system. The system controller executes system control software, which is a computer program stored in a computer-readable medium. Preferably, the medium is a hard disk drive, but the medium may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or another appropriate drive, may also be used to instruct the system controller.

A process for depositing a film stack (e.g. sequential deposition of a silicon-oxygen-and-hydrogen-containing layer and then a silicon-oxygen-and-carbon-containing layer) on a substrate, converting a film to silicon oxide or a process for cleaning a chamber can be implemented using a computer program product that is executed by the system controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller is via a flat-panel touch-sensitive monitor. In the preferred embodiment two monitors are used, one mounted in the clean room wall for the operators and the other behind the wall for the service technicians. The two monitors may simultaneously display the same information, in which case only one accepts input at a time. To select a particular screen or function, the operator touches a designated area of the touch-sensitive monitor. The touched area changes its highlighted color, or a new menu or screen is displayed, confirming communication between the operator and the touch-sensitive monitor. Other devices, such as a keyboard, mouse, or other pointing or communication device, may be used instead of or in addition to the touch-sensitive monitor to allow the user to communicate with the system controller.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. The term "precursor" is used to refer to any process gas which takes part in a reaction to either remove material from or deposit material onto a surface. A gas in an "excited state" describes a gas wherein at least some of the gas molecules are in vibrationally-excited, dissociated and/or ionized states. A gas (or precursor) may be a combination of two or more gases (or precursors). A "radical precursor" is used to describe plasma effluents (a gas in an excited state which is exiting a plasma) which participate in a reaction to either remove material from or deposit material on a surface. A "radical-oxygen precursor" is a radical precursor which contains oxygen and may be nitrogen-free in embodiments. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The terms "gap" or "trench" are used throughout with no implication that the etched geometry has a large horizontal aspect ratio. Viewed from above the surface, gaps and trenches may appear circular, oval, polygonal, rectangular, or a variety of other shapes. As used herein, a conformal layer refers to a generally uniform layer of material on a surface in the same shape as the surface, i.e., the surface of the layer and the surface being covered are generally parallel. A person having ordinary skill in the art will recognize that the deposited material likely cannot be 100% conformal and thus the term "generally" allows for acceptable tolerances.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of forming a silicon-carbon-oxygen layer on a patterned substrate, the method comprising:
    transferring the patterned substrate into a substrate processing region of a substrate processing chamber;
    flowing an oxygen-containing precursor into a remote plasma region while igniting a remote plasma to form a radical oxygen precursor;
    flowing a silicon-and-carbon-containing precursor into a substrate processing region without first passing the silicon-and-carbon-containing precursor through a plasma, wherein the silicon-and-carbon-containing precursor has two distinct silicon atoms separated by at least one carbon atom;
    flowing the radical oxygen precursor into the substrate processing region;
    combining the silicon-and-carbon-containing precursor and the radical oxygen precursor in the substrate processing region to form a silicon-carbon-oxygen layer on the patterned substrate, wherein the silicon-carbon-oxygen layer is flowable during formation; and
    curing the silicon-carbon-oxygen layer, wherein the formed silicon-carbon-oxygen layer comprises an atomic percentage of carbon content greater than 5%, and wherein the cured silicon-carbon-oxygen layer is characterized by a wet etch rate ratio (WERR) of less than 0.5 compared to thermal silicon oxide in a dilute HF solution.

2. The method of claim 1, wherein the silicon-and-carbon-containing precursor comprises 1,3,5-trisilapentane, 1,4,7-trisilaheptane, disilacyclobutane, trisilacyclohexane, 1,4-disilabutane, disilacyclohexane, disilacyclopentane, or disilapropane.

3. The method of claim 1, wherein the silicon-and-carbon-containing precursor comprises:
    (i) $SiR_4$, $Si_2R_6$, $Si_3R_8$, $Si_4R_{10}$, or $Si_5R_{12}$, wherein each R group is independently hydrogen (—H) or a saturated or unsaturated alkyl group;
    (ii) a silylalkane or silylalkene having the formula $R_3Si$—$[CH_2]_n$—$SiR_3$, wherein n may be an integer from 1 to 10, and each of the R groups are independently a hydrogen (—H), or a saturated or unsaturated alkyl group;
    (iii) a silylalkane or silylalkene having the formula $R_3Si$—$[CR_2]_x$—$SiR_2$—$[CR_2]_y$—$SiR_3$, wherein x and y are independently an integer from 1 to 10, and each of the R groups are independently a hydrogen (—H), or a saturated or unsaturated alkyl group;

(iv) a silacycloalkane or silacycloalkene selected from the group consisting of silacyclopropanes, silacyclobutanes, silacyclopentanes, silacyclohexanes, silacycloheptanes, silacyclooctanes, silacyclononanes, silacyclopropenes, silacyclobutenes, silacyclopentenes, silacyclohexenes, silacycloheptenes, silacyclooctenes, and silacyclononenes;

(v) $H_{4-x-y}CX_y(SiR_3)_x$, where x is 1, 2, 3, or 4, y is 0, 1, 2 or 3, each X is independently a hydrogen or halogen (e.g., F, Cl, Br), and each R is independently a hydrogen (—H) or an alkyl group;

(vi) $(SiR_3)_xC=C(SiR_3)_x$, where x is 1 or 2, and each R is independently a hydrogen (—H) or an alkyl group; or (vii) R—[(CR'$_2$)$_x$—(SiR"$_2$)$_y$—(CR'$_2$)$_z$]$_n$—R, wherein each R, R', and R" are independently a hydrogen, an alkyl group, an unsaturated alkyl group, a silane group, or (viii) [(CH$_2$)$_{x1}$—(SiH$_2$)$_{y1}$—(CH$_2$)$_{z1}$]$_{n1}$—R''' wherein x1, y1 and z1 are independently a number from 0 to 10, and n1 is a number from 0 to 10, wherein R''' is a hydrogen, alkyl group, unsaturated alkyl group, or silane group, and wherein x, y and z are independently a number from 0 to 10, and n is a number from 0 to 10.

4. The method of claim 1, wherein the silicon-and-carbon-containing precursor comprises one of 1,3,5-trisilapentane or 1,4,7-trisilaheptane.

5. The method of claim 1, wherein the oxygen-containing precursor comprises oxygen ($O_2$) or ozone ($O_3$).

6. The method of claim 1, wherein the remote plasma region is a remote plasma system external to but fluidly coupled to the substrate processing chamber.

7. The method of claim 1, wherein the remote plasma region is a compartment within the substrate processing chamber but separated from the substrate processing region by a showerhead.

8. The method of claim 1, wherein the remote plasma region is excited using an inductively-coupled plasma or a capacitively-coupled plasma.

9. The method of claim 1, wherein a temperature of the patterned substrate is less than 400° C. during formation of the silicon-carbon-oxygen layer.

10. The method of claim 1, wherein the silicon-and-carbon-containing precursor is nitrogen-free.

11. The method of claim 1, wherein the silicon-carbon-oxygen layer is nitrogen-free.

12. The method of claim 1, wherein the silicon-and-carbon-containing precursor consists of silicon, carbon and hydrogen.

13. The method of claim 1, wherein the silicon-carbon-oxygen layer consists of silicon, carbon, oxygen and hydrogen.

14. The method of claim 1, wherein the two distinct silicon atoms are separated by at least two covalently carbon atoms bonded in series.

15. The method of claim 1, wherein the two distinct silicon atoms are separated by only carbon atoms.

16. The method of claim 1, wherein the two distinct silicon atoms are separated by carbon atoms but no nitrogen atoms.

17. The method of claim 1, wherein the two distinct silicon atoms are separated by carbon atoms but no oxygen atoms.

18. A method of forming a silicon-carbon-oxygen layer on a patterned substrate, the method comprising:

transferring the patterned substrate into a substrate processing region of a substrate processing chamber;

flowing an oxygen-containing precursor into a remote plasma region while igniting a remote plasma to form a radical oxygen precursor, wherein the plasma is devoid of nitrogen;

flowing a silicon-and-carbon-containing precursor into a substrate processing region without first passing the silicon-and-carbon-containing precursor through a plasma, wherein the silicon-and-carbon-containing precursor consists of hydrogen and two distinct silicon atoms separated by at least one carbon atom;

flowing the radical oxygen precursor into the substrate processing region, wherein each of the flowing operations are devoid of nitrogen;

combining the silicon-and-carbon-containing precursor and the radical oxygen precursor in the substrate processing region to form a silicon-carbon-oxygen layer on the patterned substrate, wherein the silicon-carbon-oxygen layer is flowable during formation; and curing the silicon-carbon-oxygen layer, wherein the formed silicon-carbon-oxygen layer comprises an atomic percentage of carbon content greater than 10%, wherein the formed layer is devoid of nitrogen, and wherein the cured silicon-carbon-oxygen layer is characterized by a wet etch rate ratio (WERR) of less than 0.1 compared to thermal silicon oxide in a dilute HF solution.

* * * * *